(12) United States Patent
Ohsawa et al.

(10) Patent No.: US 6,191,592 B1
(45) Date of Patent: Feb. 20, 2001

(54) CONNECTION INSPECTING APPARATUS FOR A CORD AND A METHOD FOR INSPECTING A CONNECTION OF A CORD

(75) Inventors: Hiroyuki Ohsawa; Hitoshi Ohkubo, both of Iwate (JP)

(73) Assignee: Sumitomo Wiring Systems, Ltd. (JP)

( * ) Notice: Under 35 U.S.C. 154(b), the term of this patent shall be extended for 0 days.

(21) Appl. No.: 09/237,333

(22) Filed: Jan. 25, 1999

(30) Foreign Application Priority Data

Feb. 2, 1998 (JP) .................................................. 10-21088

(51) Int. Cl.[7] .......................... H01H 31/04; H01R 13/62
(52) U.S. Cl. ............................................. 324/538; 439/310
(58) Field of Search ................................. 324/538, 158.1, 324/537; 439/310

(56) References Cited

U.S. PATENT DOCUMENTS

| | | | |
|---|---|---|---|
| 4,902,968 | * 2/1990 | Sugimoto | 324/538 |
| 5,490,798 | * 2/1996 | Murakami et al. | 324/158.1 |
| 5,512,833 | * 4/1996 | Fukuda et al. | 324/538 |

* cited by examiner

*Primary Examiner*—Safet Metjahic
*Assistant Examiner*—J. Kerveros
(74) *Attorney, Agent, or Firm*—Anthony J. Casella; Gerald E. Hespos; Michael J. Porco

(57) ABSTRACT

An apparatus is provided to facilitate connection inspections for a high tension cord 1. The apparatus includes a contact element that can be brought into contact with a distributor terminal T2. The contact element includes elastic elements 31b to 34b that are constructed to be displaceable between an enclosed state where they enclose the distributor terminal T2 to establish an electrical connection therewith and an open state where a high tension cord 1 can be mounted and detached. Since the distributor terminal T2 can be connected electrically without precisely positioning it, connection inspections for the high tension cord 1 can be made easier and, consequently, automation and labor-saving can be made possible.

14 Claims, 4 Drawing Sheets

CONNECTION INSPECTING APPARATUS FOR A CORD AND A METHOD FOR INSPECTING A CONNECTION OF A CORD

BACKGROUND OF THE INVENTION

1. Field of the Invention

The present invention relates to a connection inspecting apparatus for a cord, such as a high tension cord and to a method for inspecting a connection of such a cord.

2. Description of the Prior Art

A high tension cord that is used in an internal combustion engine of an automotive vehicle generally is a highly flexible cable product used to electrically connect a distributor and a sparking plug of an ignition system. The high tension cord includes a high-voltage resistive cable comprised of a wire having terminals at the respective connecting portions and an insulating coating for coating the wire. A distributor connecting cap is fixed to one end of the high-voltage resistive cable for connection with the distributor, and a plug connecting pipe is fixed to the other end of the high-voltage resistive cable for connection with one of the sparking plug. Corresponding terminals are exposed from the distributor connecting cap and the plug connecting pipe by specified lengths to form a distribution connecting portion at the distributor connecting cap side and a sparking plug connecting portion at the plug connecting pipe side.

The high tension cord has a high voltage applied thereto while being used, and is required to have high precision and durability. Accordingly, in the production process of the high tension cord, various factors such as a projecting length of a sparking plug terminal provided in the plug connecting pipe, a conductive state, and a resistance value are strictly inspected (hereinafter, these inspections are referred to as "connection inspections", and may comprise a conductive state inspection and a resistance value inspection).

An inspecting apparatus for semiautomatically inspecting the high tension cord has conventionally been used to conduct the connection inspections for the high tension cord. This prior art inspection apparatus is provided with an inspecting device for simultaneously conducting the connection inspections between a pair of contact elements which are so provided as to correspond to the respective connecting portions of the high tension cord and a positioning member for positioning the high tension cord in a position where the connection inspections can be performed by the inspecting device. After uninspected high tension cords are positioned by the positioning member and the connection inspections are conducted for them by the prior art inspecting device, they are unloaded from the positioning member and sorted into satisfactory products and defective products.

The prior art high tension cord has a high flexibility as described above. As a result, the plug connecting portion can be positioned relatively easily by the presence of the plug connecting pipe. However, it is difficult to position the distributor connecting portion because it is difficult to orient this portion. Thus, an operator specially stationed for the inspection apparatus conventionally has conducted the connection inspections by manually connecting the distributor end terminal of the high tension cord with the contact elements made of a copper plate.

As described above, it is difficult to position the distributor connecting portion in the conventional inspecting apparatus during the connection inspections for the high tension cord and, therefore, the operator is burdened considerably during the connection inspections and labor costs tend to be high.

In view of the above problem, an object of the present invention is to provide an inspecting apparatus and a method for performing connection inspections for a cord, in particular a high tension cord which makes the connection inspections for the cord easier and enables automation and labor-saving.

SUMMARY OF THE INVENTION

According to the invention, there is provided a connection inspecting apparatus for a cord having a first connecting portion, from which a first terminal is substantially exposed, and a second connecting portion, from which a second terminal is substantially exposed. The apparatus comprises an inspecting device for performing a connection inspection between a pair of contact elements which are provided to correspond to the respective connecting portions of the cord. The apparatus also comprises a positioning member for positioning the first connecting portion with respect to one contact element of the inspecting device so that the connection inspection can be performed. The positioning member also causes the second connecting portion to be suspended. The other contact element of the inspecting device is constructed to be displaceable between an open state where the cord can be mounted in and detached from the positioning member and a substantially enclosed state where the second connecting portion is substantially enclosed. The other contact element of the inspecting device comprises a conductive elastic element to be connected electrically with the second terminal in the substantially enclosed state.

According to a preferred embodiment of the invention, the cord is a high tension cord. The high tension cord has a plug connecting portion, as a first connecting portion, from which a plug terminal, as a first terminal to be connected with a sparking plug, is exposed. The high tension cord also has a distributor connecting portion as a second connecting portion, from which a distributor terminal, as a second terminal to be connected with a distributor, is exposed.

Preferably, the second connecting portion is caused to be suspended by the action of gravity.

According to a further preferred embodiment, there is provided a connection inspecting apparatus for a high tension cord having a plug connecting portion, from which a plug terminal to be connected with a sparking plug is exposed, and a distributor connecting portion, from which a distributor terminal to be connected with a distributor is exposed. The apparatus comprises an inspecting device for performing a connection inspection between a pair of contact elements which are so provided as to correspond to the respective connecting portions of the high tension cord. The apparatus also comprises a positioning member for positioning the plug connecting portion with respect to one contact element of the inspecting device so that the connection inspection can be performed. The positioning member also causes the distributor connecting portion to be suspended by the action of gravity. The other contact element of the inspecting device is so constructed as to be displaceable between an open state, where the high tension cord can be mounted in and detached from the positioning member, and an enclosed state, where the distributor connecting portion is enclosed. The other contact element of the inspecting device comprises a conductive elastic element to be electrically connected with the distributor terminal in the enclosed state.

In the preceding embodiment, opposite ends of the high tension cord can be brought into contact with the corresponding contact elements during connection inspections by positioning only the easily positionable plug side end and displacing the elastic element from the open state to the enclosed state at the distributor side.

In a preferable embodiment, the elastic element is a coil spring extending along the longitudinal direction of the cord, to be inspected in the substantially enclosed state.

Preferably, the other contact element has a longitudinal length or extension that is dimensioned to compensate for longitudinal size differences of the cord.

According to these preferable embodiments, the elastic element extends along the longitudinal direction of the cord, preferably the high tension cord in the substantially enclosed state. Consequently, longitudinal size differences of high tension cords can be compensated for in a relatively long range.

The inspecting device preferably comprises an enclosing mechanism with a plurality of enclosing members, which are displaceable with respect to each other to substantially enclose the second connection portion of the cord in the substantially enclosed state.

Most preferably, one or more enclosing members is/are linearly and/or pivotably or rotatably movable by one or more actuators.

According to the invention, there is further provided a method for inspecting a connection of a cord which may use a connection inspection apparatus as described above. The method comprises conveying a cord to be inspected along a feed path. The method proceeds by positioning a first connection portion, preferably a plug connection portion, of the cord on a positioning member with respect to a contact element of an inspecting device and causing a second connection portion, preferably a distributor connection portion, of the cord to extend in a suspended position, preferably by the action of gravity. The method continues by substantially enclosing the second connection portion by an enclosing mechanism thereby electrically connecting it with another contact element and then inspecting the electrical connection of the first and second connecting portions in the substantially enclosed state. The method then may conclude by conveying the cord along a conveyance path in case it has passed the connection inspection, or conveying the cord along a return path in case it has not passed the connection inspection.

Accordingly, in conducting the connection inspections, the opposite ends of the cord, in particular the high tension cord, can be brought into contact with the corresponding contact elements by positioning only the easily positionable first or plug side end and displacing the elastic element from the open state to the enclosed state at the second or distributor side.

According to a preferred embodiment of the invention, the step of substantially enclosing the second connection portion is performed by linearly and/or pivotably or rotatably displacing one or more enclosing members of the enclosing mechanism.

Preferably, the step of electrically connecting the second connecting portion with the other contact element is performed by at least partly elastically deflecting other contact element.

These and other objects, features and advantages of the present invention will become more apparent upon a reading of the following detailed description and accompanying drawings.

DETAILED DESCRIPTION OF THE PREFERRED EMBODIMENT

Figure 1:
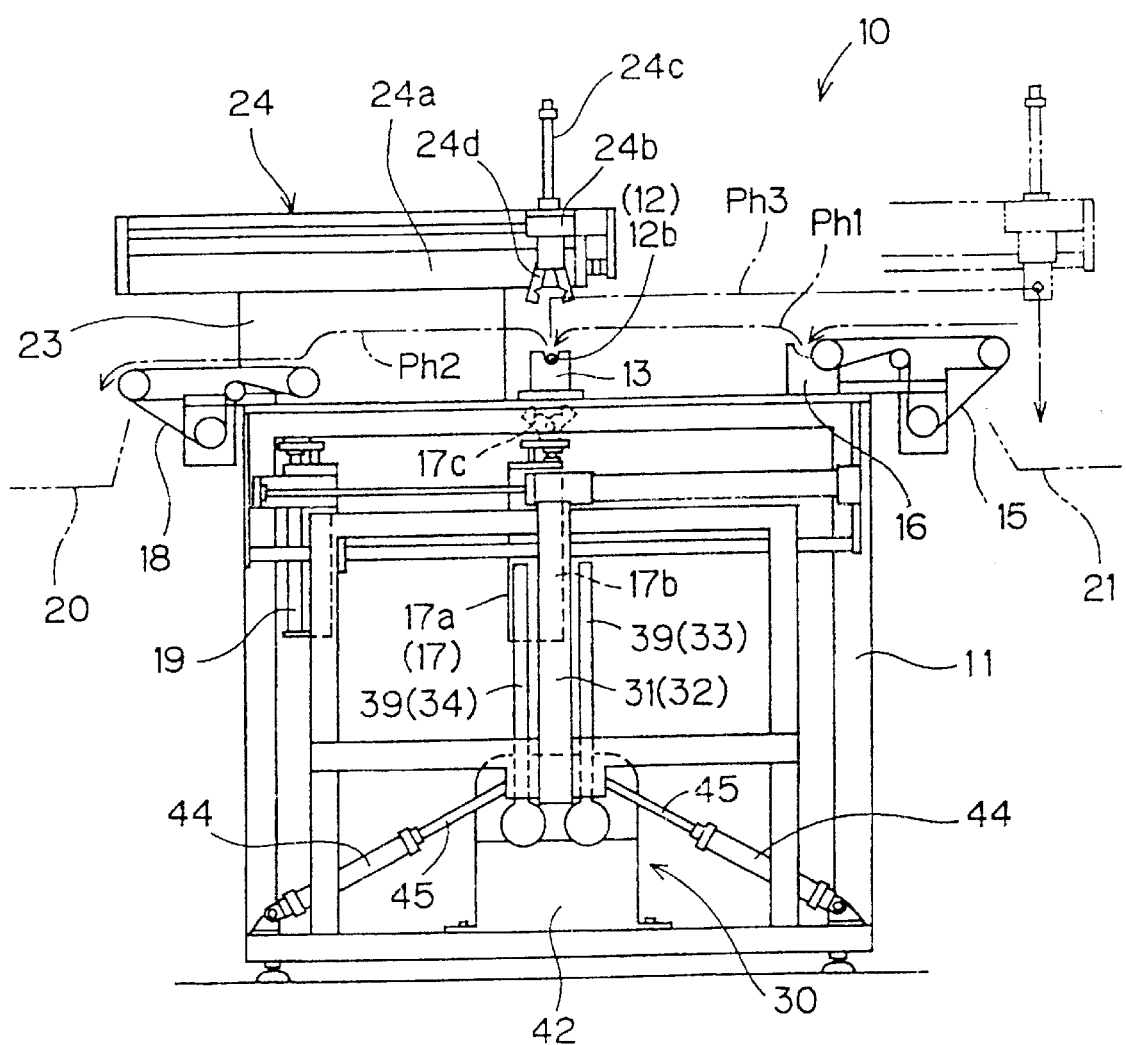
FIG. 1 is a front schematic view showing the schematic construction of a connection inspecting apparatus according to one embodiment of the invention.
Figure 2:
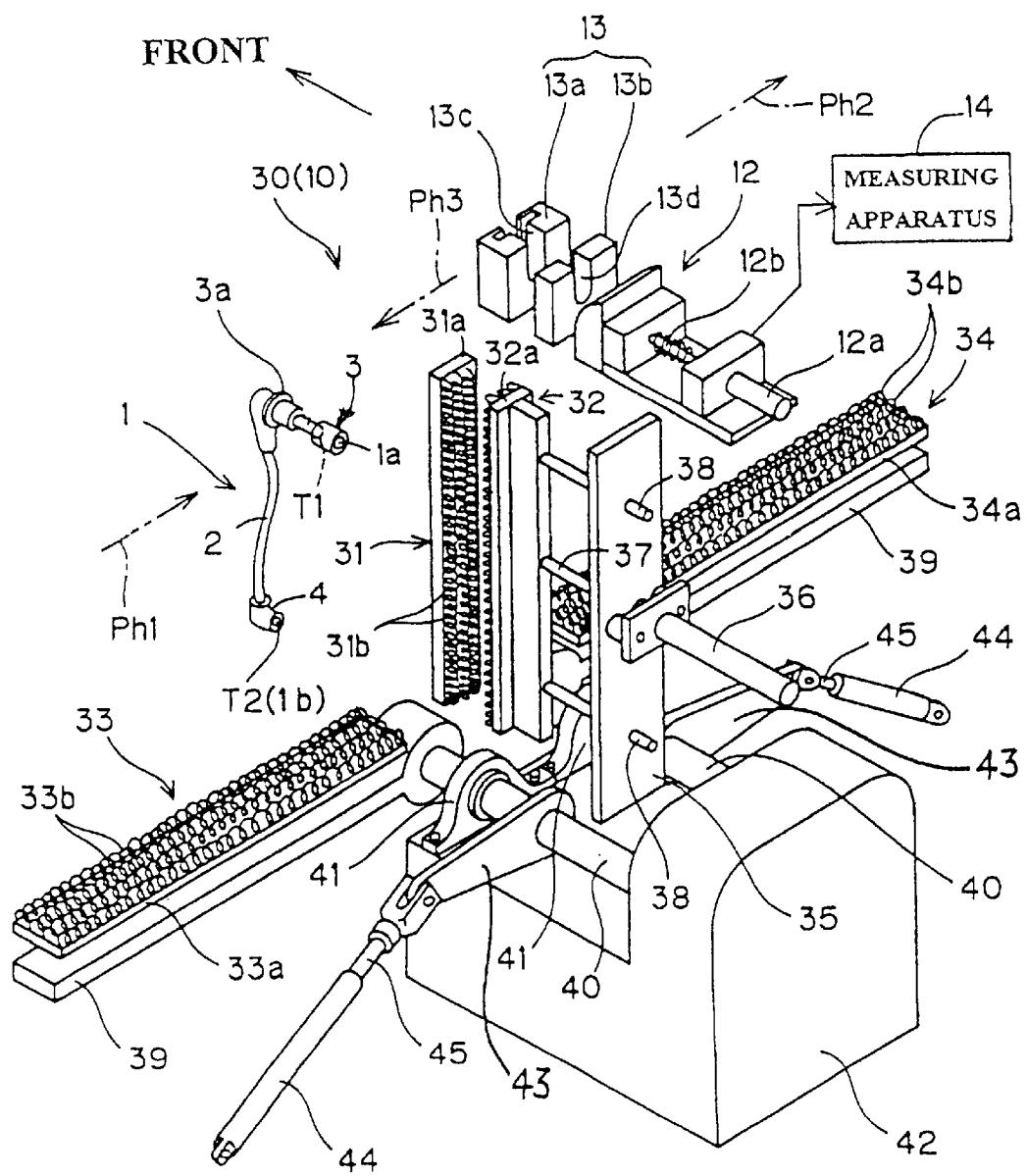
FIG. 2 is a perspective view of an essential portion of the connection inspecting apparatus of FIG. 1 when viewed from behind.

An inspecting apparatus in accordance with one embodiment of the invention is identified generally by the numeral 10 in FIGS. 1 and 2. The inspecting apparatus 10 is operative to inspect a high tension cord as shown in FIG. 2. The high tension cord 1 to be inspected in the inspection apparatus 10 is an integral assembly of a high-voltage resistive cable 2, a plug connecting pipe 3 connected at one end of the high-voltage resistive cable 2 and a distributor connecting cap 4 connected at the other end thereof. The high-voltage resistive cable 2 has a high-voltage resistive wire (not shown) inside and has terminals T1, T2 connected at its opposite ends. One terminal T1 is a plug terminal which is or can be introduced through the plug connecting pipe 3 and is exposed to the outside through an opening of the plug connecting pipe 3 so as to be connected with an unillustrated sparking plug. The other terminal T2 is a distributor terminal which is partly exposed from the distributor connecting cap 4 so as to be connectable with an unillustrated distributor. In the following description, a leading end of the plug connecting pipe 3 is referred to as a plug connecting portion 1a and a portion of the terminal T2 exposed from the distributor connecting cap 4 is referred to as a distributor connecting portion 1b.

With reference to FIGS. 1 and 2, the connection inspecting apparatus 10 for performing connection inspections for the high tension cord 1, as described above, is provided with a plug terminal inspecting unit 12 and a positioning member 13 on the top of a frame 11 assembled to have a substantially boxlike shape. The positioning member 13 positions the plug terminal T1 with respect to the plug inspecting unit 12 preferably by holding the plug connecting pipe 3 of the high tension cord 1.

The plug terminal inspecting unit 12 is of a known type which includes an air cylinder 12a which is fixed to project longitudinally and preferably substantially horizontally backwardly. The plug terminal inspecting unit 12 also includes a pin 12b as a contact element which is moved along a longitudinal direction, preferably forwardly and backwardly by the air cylinder 12a. The pin 12b has an electrical conductivity. The pin 12b is brought into contact with the positioned plug terminal T1 of the high tension cord 1 while being connected with a measuring apparatus 14 that includes a resistance measuring circuit. Thus, the plug terminal inspecting unit 12 inspects a projecting length, an electrical resistance value and a conductive state of the plug terminal T1.

As shown in FIG. 2, the positioning member 13 is comprised of a pair of metal blocks 13a, 13b which are spaced apart in longitudinal or forward and backward directions. The metal blocks 13a and 13b are formed with laterally or upward opening slits 13c and 13d respectively. The slit 13c formed in the first or front block 13a has such a configuration that a flange 3a formed at the base end of the plug connecting pipe 3 can be accommodated. The base end of the plug connecting pipe 3 is positioned by being substantially accommodated in the slit 13c, and the leading end is positioned by being accommodated in the slit 13d of the second or rear block 13b. In this way, the plug terminal T1 can be positioned precisely with respect to the plug terminal inspecting unit 12. The positioning member 13 enables the distributor connecting portion 1b of the positioned high tension cord 1 to be suspended preferably by the action of gravity. Additionally or alternatively a holding mechanism (not shown) is provided for substantially stretching or positioning the high tension cord 1 in a predetermined or predeterminable position.

With reference to FIG. 1, the frame 11 is provided with a feed path ph1 for feeding an uninspected high tension cord 1 to the positioning member 13, a conveyance path ph2 for conveying the high tension cord 1 that has passed the inspection to a downstream side of the positioning member 13, and a return path ph3 for returning the high tension cord 1 that has failed the inspection to an upstream side of the feed path ph1.

To convey the corresponding high tension cords 1 along the respective paths ph1 to ph3, the frame 11 is provided with a plurality of conveyor mechanisms.

First, an endless conveyor 15 is arranged at one upper end of the frame to feed the high tension cord 1. An uninspected high tension cord 1 is placed on the endless conveyor 15 by an unillustrated hand robot to be fed substantially horizontally to a core exposing member 16 provided in an intermediate position of the feed path ph1.

The core exposing member 16 positions the plug connecting pipe 3 of the high tension cord 1 from the endless conveyor 15, exposes a core thereof, and transfers the high tension cord 1 to a clamp or hand robot 17.

The hand robot 17 is a simple biaxial robot which includes a frame 17a mounted on the frame 11, an air cylinder 17b substantially vertically mounted in or on the frame 17a, and a manipulator 17c. The manipulator 17c is movable in a direction at an angle different from 0° or 180°, preferably substantially normal to an extension direction of the high tension cord 1 and/or of the plug connecting pipe 3, that is arranged in or on the positioning member 13. Preferably the manipulator 17c is movable substantially upwardly and downwardly by the air cylinder 17b. The hand robot 17 reciprocatingly moves along the feed path ph1. As part of this reciprocation, the hand robot 17 is moved to the positioning member 13 to mount the plug connecting pipe 3 of the high tension cord 1 in the positioning member 13 while gripping it by the manipulator 17c. During this movement, the plug connecting pipe 3 preferably has its core exposed by the core exposing member 16. The hand robot 17 then is returned to the core exposing member 16 to grip the plug connecting pipe 3 of the next high tension cord 1 on the core exposing member 16.

An endless conveyor 18 is arranged at the other lateral or upper end of the frame 11. A clamp or hand robot 19 places the high tension cord 1 that has passed the inspection on the endless conveyor 18 to convey the high tension cord 1 along the conveyance path ph2, and to store satisfactory products that have passed the inspection into a container 20, such as a tray or hanger. The hand robot 19 has substantially the same construction as the hand robot 17 and is assembled with or to the frame 11 such that the hand robot 19 can convey the high tension cord 1 by gripping it.

The respective hand robots 17, 19 described above both are constructed to be substantially reciprocatingly movable in a plane extending between the blocks 13a and 13b of the positioning member 13 described above.

High tension cords 1, that have been judged to be defective are returned along the return path ph3. For this purpose, a stay 23 stands on the other upper end of the frame 11 and a return robot 24 is mounted on the stay 23. The return robot 24 is a simple biaxial robot which includes a first air cylinder 24a extending preferably substantially horizontally. A carrier 24b is mounted on a rod of the air cylinder 24a. A second air cylinder 24c extends or is arranged at an angle different from 0° or 180°, preferably substantially normal to the first air cylinder 24a, and preferably substantially vertically. The second air cylinder 24c is mounted on the carrier 24b. A manipulator 24d is driven preferably upward and downward by the second air cylinder 24c. The manipulator 24d is driven by the respective air cylinders 24a, 24c, such that the manipulator 24d grips the high tension cord 1 on the positioning member 13 from above and raises it. The manipulator 24d then conveys the high tension cord 1 along the return path ph3 and returns the high tension cord 1 to a return container 21 similar to the container 20. Then, the return robot 24 is moved back to its home position shown in FIG. 1. According to the invention, the high tension cords 1 that have been judged to be defective may be returned, e.g. onto the endless conveyor 15, where a defect may be corrected by an operator.

Figure 3:
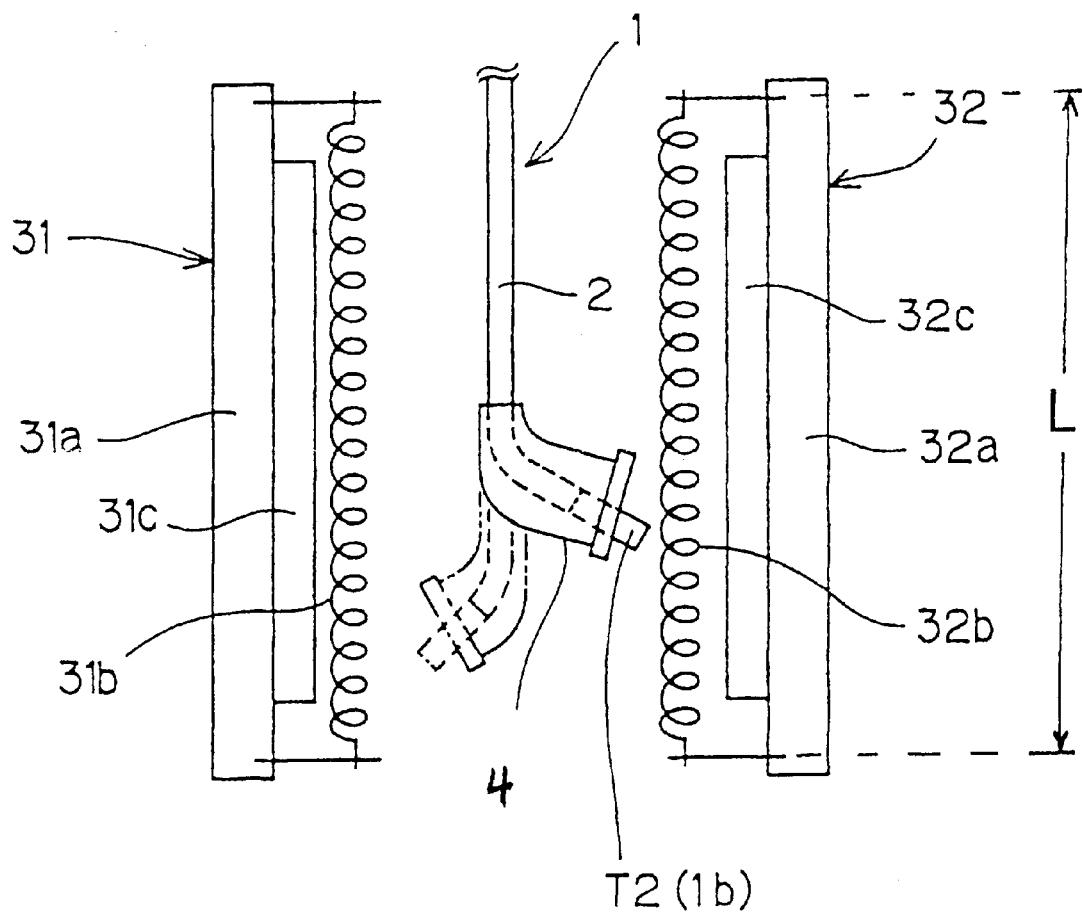
FIG. 3 is a schematic side view showing the action of an enclosing mechanism according to the embodiment of FIG. 1.

Next, with reference to FIGS. 2 and 3, an enclosing mechanism 30 which constructs an inspecting device of the illustrated embodiment together with the aforementioned plug terminal inspecting unit 12 is described in detail. FIG. 3 is a schematic side view showing the action of the enclosing mechanism 30 according to the embodiment shown in FIG. 1.

An enclosing mechanism of the subject invention is identified by the numeral 30 in FIGS. 2 and 3. The enclosing mechanism 30 is comprised of enclosing members 31 to 34 for substantially enclosing four sides of the distributor connecting portion 1b of the high tension cord 1 having the plug connecting pipe 3 positioned in the positioning member 13.

As also shown in FIG. 3, the respective enclosing members 31 to 34 include long substantially rectangular metal mount plates 31a to 34a and a plurality of coil springs 31b to 34b mounted on the surfaces of the mount plates 31a to 34a facing the high tension cord 1, respectively. The respective coil springs 31b to 34b have longitudinal lengths or extensions L (FIG. 3) and act as contact elements to be brought into contact with the distributor terminal T2 of the high tension cord 1 and are electrically connected with the aforementioned measuring apparatus 14.

As shown in FIG. 2, the respective coil springs 31b to 34b are wound at intervals of about 3 mm. By arranging each of the coil springs 31b to 34b in a plurality of rows, the distributor terminal T2 can be enclosed substantially, thereby leaving substantially no clearances between the coil spring(s) 31b–34b and the distributor terminal T2. In the illustrated embodiment, rubber sponge sheets 31c to 34c (shown only in FIG. 3) are arranged between the coil springs 31b to 34b and the corresponding mount plates 31a to 34a to elastically take up forces exerted on the respective coil springs 31b to 34b when the high tension cord 1 is enclosed substantially, as described later.

An end portion of the high tension cord 1 is enclosed substantially by the respective enclosing members 31 to 34, as shown in FIG. 2. More particularly, the first enclosing member 31 is located before the high tension cord 1 has been positioned and suspended. The first enclosing member 31 is fixed to the frame 11 to extend substantially vertically with the coil springs 31b aligned face the high tension cord 1. The second enclosing member 32 is located behind the high tension cord 1 and is substantially movable toward and away from the first enclosing member 31. A carrying plate 35 is arranged behind the second enclosing member 32 and is fixed to the frame 11. The carrying plate functions to drive the second enclosing member 32 forward and backward. An air cylinder 36 extends along forward and backward direction and is mounted on the carrying plate 35. The air cylinder 36 has a rod 37 fixed to the rear surface of the second enclosing member 32. By driving the rod 37 of the air cylinder 35 backward and forward at specified timings, the end portion of the high tension cord 1 can be held between the first and second enclosing members 31, 32. In the illustrated embodiment, a pair of guide bars 38 are fixed to the rear surface of the second enclosing member 32 above and below the air cylinder 36 and are slidably introduced through the carrying plate 35. Accordingly, the second enclosing member 32 is driven forward and backward while being smoothly guided.

The third and fourth enclosing members 33, 34 for enclosing the high tension cord 1 at the sides of the first and second enclosing members 31, 32 are so constructed as to open and close the paths ph1, ph2 for conveying the high tension cord 1. That is the third and fourth enclosing members 33 and 34 are displaceable between an open state (state of FIG. 2) where the high tension cord 1 can be mounted in and detached from the positioning member 13 and a closed state (state of FIG. 1) where the distributor connecting portion 1b of the high tension cord 1 positioned by the positioning member 13 is enclosed.

Specifically, the third and fourth enclosing members 33, 34 are arranged substantially symmetrically and fixed to ends of a pair of rotatable shafts 40 extending along the forward and backward directions via mount plates 39. Thus the third and fourth enclosing members 33 and 34 each are pivotable or rotatable by a predetermined or predeterminable angle, preferably by about 90°. Accordingly, if the third and fourth enclosing members 33, 34 are pivoted or rotated to their closed or vertical positions as shown in FIG. 1, they cooperate with the first and second enclosing members 31, 32 to substantially enclose the high tension cord 1. If the third and fourth enclosing members 33, 34 are pivoted or rotated to their open or substantially horizontal positions as shown in FIG. 2, the respective paths phi, ph2 are opened so that the high tension cord 1 can be mounted in and detached from the positioning member 13.

The respective rotatable shafts 40 rotatably rest on pillow block bearings 41, which are fixed to a box 42 provided at the bottom of the frame 11.

Further, a drive arm 43 is fixed in an intermediate position of each rotatable shaft 40, and a rod 45 of an air cylinder 44 is coupled (pivotable or rotatably) with this drive arm 43. The air cylinders 44 have ends thereof obliquely supported at the opposite bottom ends of the frame 11 as shown in FIG. 1, and rotate the rotatable shafts 40 toward the right and left in a range preferably of about 90° via the drive arm 43 by extending and contracting the rods 45.

Figure 4:
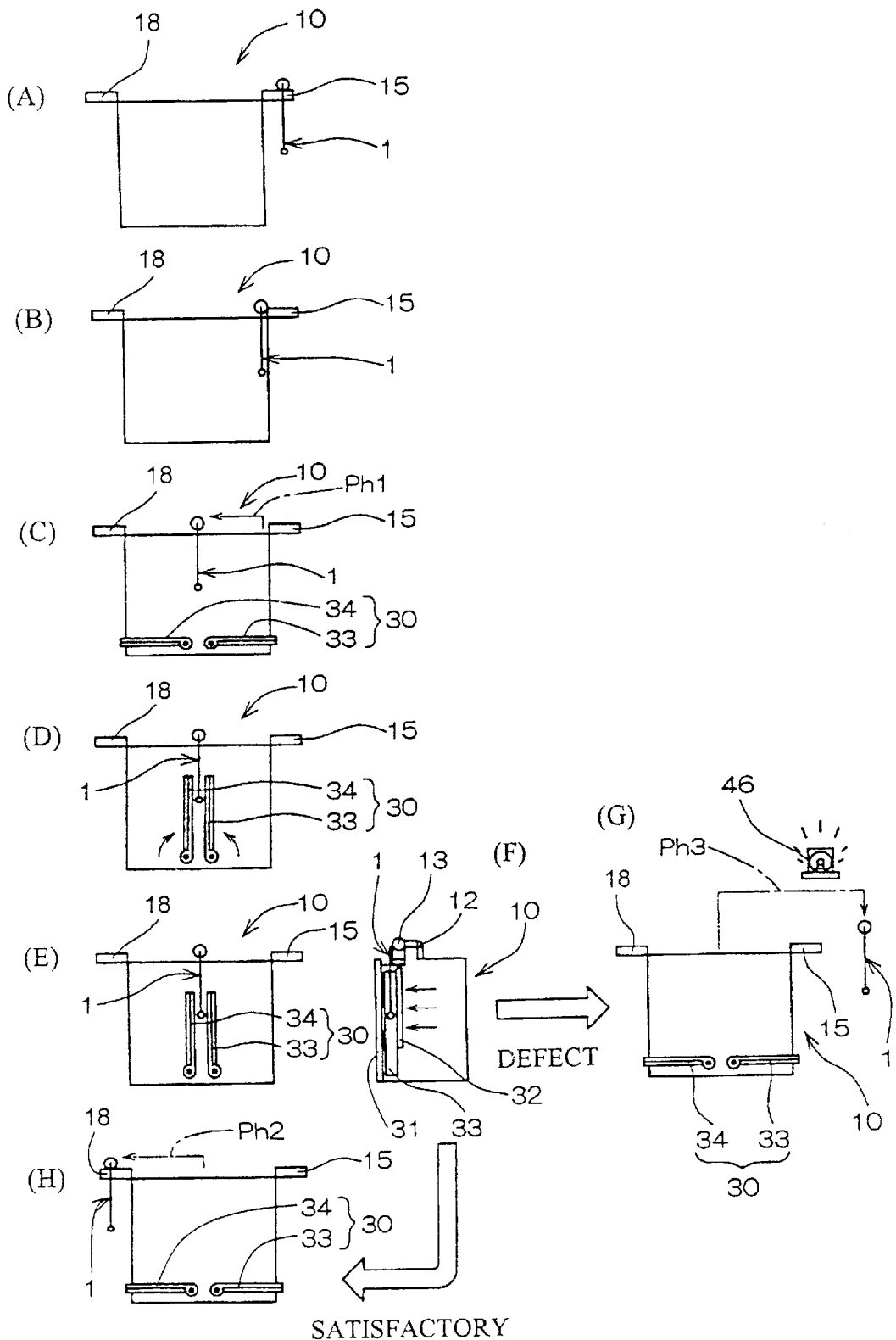
FIG. 4 is a schematic diagram showing an operation procedure of the connection inspecting apparatus according to the embodiment of FIG. 1.

FIG. 4 is a schematic diagram showing an operation procedure of the connection inspecting apparatus 10 according to the embodiment of FIG. 1.

In the above construction, when the high tension cord 1 is placed on the endless conveyor 15 as shown in FIG. 4(A) by an unillustrated hand robot, it is conveyed to the downstream side by the endless conveyor 15, which conveys the high tension cord 1 preferably to the core exposing member 16 (see FIG. 1) as shown in FIG. 4(B).

Subsequently, the high tension cord 1, that has had its core exposed by the core exposing member 16, is conveyed along the path ph1 by the hand robot 17 (see FIG. 1) as shown in FIG. 4(C) and is positioned in or on the positioning member 13 (see FIG. 2).

Upon the completion of conveyance of the high tension cord 1 to the positioning member 13, the hand robot 17 is moved back to the core exposing member 16 to open the path ph1 so that a bottom portion of the suspended high tension cord 1 can be enclosed substantially by the enclosing mechanism 30.

Thereafter, the third and fourth enclosing members 33, 34 are rotated to their closed or substantially vertical positions by extending the rods 45 of the respective air cylinders 44 (see FIG. 1) of the enclosing mechanism 30 as shown in FIG. 4(D), thereby substantially enclosing three sides of the high tension cord 1 together with the first enclosing member 32.

Subsequently or simultaneously, the second enclosing member 32 is moved toward the first enclosing member 31 by extending the rod 37 of the air cylinder 36 (see FIG. 2) of the enclosing mechanism 30 as shown in FIGS. 4(E) and 4(F). In this way, the bottom portion of the high tension cord 1 is enclosed substantially completely by the respective enclosing members 31 to 34. Thus, the distributor terminal T2 of the high tension cord 1 is brought into contact with at least one of the coil springs 31b to 34b regardless of in which direction it is pointed, and an electrical connection between the enclosing mechanism 30 and the distributor terminal T2 is ensured. Simultaneously, the pin 12b of the plug terminal inspecting unit 12 described with reference to FIG. 2 is caused to project forward for electrical connection with the positioned plug terminal T1. In this way, the so-called connection inspections can be performed automatically.

Upon the completion of the connection inspections, the high tension cord 1 is returned along the return path ph3 as shown in FIG. 4(G) if it is judged to be defective and a defect processing is performed. In the illustrated example, a defect is notified using a notification lamp 46. On the other hand, if the high tension cord 1 is judged to be satisfactory, it is conveyed along the conveyance path ph2 as shown in FIG. 4(H) to be stored in the container 20.

In the embodiment described above, the opposite ends of the high tension cord 1 can be brought into contact with the corresponding contact elements (pin 12b, coil springs 31b to 34b) by positioning only the easily positionable plug side end of the high tension cord 1 and displacing the enclosing members 31 to 34 including coil springs 31b to 34b as elastic elements from the open state to the substantially enclosed state at the distributor side of the high tension cord 1 when the connection inspections of the high tension cord 1 are performed. Accordingly, an operator needs not be involved in the positioning operation and the connection inspections, enabling automatic connection inspections. Therefore, the connection inspections for the high tension cord 1 can be made considerably easy and, in the case that biaxial robots are adopted, there is a remarkable effect that automation and labor-saving can be realized easily.

Particularly in the aforementioned embodiment, the coil springs 31b to 34b as elastic elements substantially extend along the longitudinal direction of the high tension cord 1 to be inspected in the substantially enclosed state (FIG. 1). Accordingly, the respective coil springs 31b to 34b extend along the longitudinal direction of the high tension cord 1 in the substantially enclosed state and a have a longitudinal length L, which allows for a positioning thereof at on or both sides of the distributor connecting portion 1b in the substantially enclosed state (FIG. 1), thereby taking up or compensating for longitudinal size differences of the high tension cords 1 in a relatively long range. Thus, in the case that high tension cords of different specifications (e.g. cord lengths of 300 mm to 700 mm) are inspected, the inspecting apparatus can handle the high tension cords 1 of various lengths, thereby showing an advantage of high versatility.

The foregoing embodiment is nothing but a preferred specific example of the invention, and the invention is not limited thereto. It should be appreciated that a variety of design changes can be made within the scope of the present invention as claimed.

Instead of air cylinders other moving means or actuators, such as screw or worm gear means can be used.

What is claimed is:

1. A connection inspecting apparatus for a cord having a first connecting portion from which a first terminal is exposed and a second connecting portion from which a second terminal is exposed, comprising:
    an inspecting device having first and second contact elements provided for connection to the respective connecting portions of the cord,
    a positioning member for positioning the first connecting portion with respect to the first contact element of the inspecting device so that a connection inspection can be performed, the positioning member further causing the second connecting portion to be suspended along a longitudinal direction of the cord, and
    the second contact element of the inspecting device comprising a plurality of enclosing members that are displaceable between an open state where the cord can be mounted in and detached from the positioning member and a substantially enclosed state where the second connecting portion is enclosed, the second contact element comprising at least one conductive coil spring mounted to at least one of the enclosing members of the enclosing members and disposed to be parallel to the longitudinal direction of the cord when the enclosing members are in the enclosed state, such that the coil spring is electrically connected with the second terminal when the enclosing members are displaced to the enclosed state.

2. A connection inspecting apparatus according to claim 1, wherein the positioning member is configured to suspend the second connecting portion by action of gravity.

3. A connection inspecting apparatus according to claim 1, wherein the second contact element has a longitudinal length selected to accommodate cords of different lengths.

4. A connection inspecting apparatus according to claim 1, wherein at least one of the enclosing members is linearly movable by at least one actuator.

5. A connection inspecting apparatus according to claim 4, wherein at least one of the enclosing members is pivotably movable by at least one actuator.

6. A connection inspection apparatus according to claim 1, wherein the cord includes a longitudinal axis, the coil spring being parallel to and offset from the longitudinal axis of the cord, such that outer surface regions of the coil spring are urged into electrical connection with the second contact element.

7. A connection inspection apparatus according to claim 1, wherein the at least one coil spring comprises a plurality of coil springs mounted respectively to each of the plurality of enclosing members.

8. A method for inspecting connections of cords each said cord having opposite first and second ends and first and second connection portions at the respective ends, said method comprising the steps of:
    conveying the cords to be inspected along a feed path;
    positioning the first connection portion, of one said cord on a positioning member with respect to a first contact element of an inspecting device;
    causing the second connection portion of the cord to extend in a suspended position, by the action of gravity;
    substantially enclosing the second connection portion by a plurality of enclosing members, at least one of said enclosing members having a conductive coil spring aligned substantially parallel to the cord, said coil spring defining a second contact element, thereby electrically connecting the second connection portion with the second contact elements;
    inspecting the electrical connection of the first and second connecting portions in the enclosed state of the enclosing members; and
    conveying along a conveyance path the cords that have passed the connection inspection and conveying along a return path the cords that have not passed the connection inspection.

9. A method according to claim 8, wherein the step of substantially enclosing the second connection portion is performed by linearly displacing at least one enclosing member of the enclosing mechanism transverse to the cord.

10. A method according to claim 9, wherein the step of substantially enclosing the second connection portion is performed by pivotably displacing at least one enclosing member of the enclosing mechanism.

11. A method according to claim 8, wherein each said enclosing member has a coil spring aligned substantially parallel to the cord, such that the step of substantially enclosing the second connection portion brings a plurality of the coil springs into connection with the second connection portion.

12. A contact element for an inspecting device to enable electrical contact with a terminal at an end of a cord, said contact element comprising a plurality of enclosing members that are displaceable between an open state and a substantially enclosed state, the enclosing members being spaced sufficiently apart in the open state to enable emplacement of the terminal between the enclosing members and removal of the terminal from the enclosing members, at least one conductive coil spring being mounted to at least one of the enclosing members, the conductive coil spring having an outer circumferential surface and being disposed on the respective enclosing member such that displacement of the enclosing members to the substantially enclosed state urges the outer circumferential surface of the conductive coil spring into contact with the terminal disposed between the enclosing members.

13. The contact element of claim 12 wherein a plurality of the enclosing members each has at least one conductive coil spring, the terminal being engaged between and contacted by the conductive coil springs when the enclosing members are in the enclosed state.

14. The contact element of claim 12 wherein each of the enclosing members comprises at least one said conductive coil spring such that the terminal is engaged between an outer circumferential portion of the conductive coil springs and contacted by at least one of the conductive coil springs when the enclosing members are in the enclosed state.

* * * * *